United States Patent
Curtis et al.

(10) Patent No.: US 10,481,658 B1
(45) Date of Patent: Nov. 19, 2019

(54) UNDER-MOTHERBOARD AIR COOLING PLENUM

(71) Applicant: Dell Products, L.P., Round Rock, TX (US)

(72) Inventors: Robert Boyd Curtis, Georgetown, TX (US); Corey Dean Hartman, Hutto, TX (US); Jonathan Foster Lewis, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/018,233

(22) Filed: Jun. 26, 2018

(51) Int. Cl.
*G06F 1/20* (2006.01)
*G06F 1/18* (2006.01)
*H05K 7/20* (2006.01)
*H05K 1/02* (2006.01)

(52) U.S. Cl.
CPC .............. *G06F 1/206* (2013.01); *G06F 1/184* (2013.01); *H05K 1/0209* (2013.01); *H05K 7/20145* (2013.01); *H05K 7/20172* (2013.01); *H05K 7/20209* (2013.01); *G06F 2200/201* (2013.01); *H05K 2201/064* (2013.01); *H05K 2201/066* (2013.01); *H05K 2201/10159* (2013.01)

(58) Field of Classification Search
CPC ..... H01L 23/467; H01L 23/3672; G06F 1/20; G06F 1/203; G06F 1/183; G06F 1/187; G06F 1/181; G06F 1/206; G06F 1/185; H05K 7/20145; H05K 7/1489; H05K 7/20727; H05K 7/1425; H05K 7/20154; H05K 7/20736; H05K 7/20136; H05K 7/20972; H05K 7/20; H05K 7/20163; H05K 7/20172; H05K 7/2039; H05K 7/20509; H05K 1/0203; H05K 7/20909; H05K 7/202; H05K 7/20563; H05K 7/20745; H05K 7/20572; H05K 7/20709; H05K 7/209; H05K 1/0209; H05K 7/1488

See application file for complete search history.

(56) References Cited

U.S. PATENT DOCUMENTS

| 2003/0155106 | A1* | 8/2003 | Malone | F28F 3/02 165/121 |
| 2004/0169956 | A1* | 9/2004 | Oba | G06F 1/20 360/97.15 |
| 2005/0122682 | A1* | 6/2005 | Streit | H05K 7/20154 361/695 |

(Continued)

*Primary Examiner* — Adam B Dravininkas
(74) *Attorney, Agent, or Firm* — Fogarty LLP

(57) ABSTRACT

Components installed on a topside of printed circuit board (PCB), such as a motherboard, are provided airflow cooling by a plurality of cooling fans located on a proximal end of the PCB. A hardware component is installed on the topside of a distal end of the PCB, furthest from the cooling fans. The hardware component includes cooling elements that extend to the underside of the PCB. Cooling the hardware component is complicated by the distance from the cooling fans and the cooling elements that extend below the PCB. A plenum extending from the proximal end of the PCB towards the distal end of the PCB is installed on the underside of the PCB. The plenum draws airflow from the cooling fans and delivers the airflow to the hardware component along the underside of the PCB, thus avoiding heating by the components on the topside of the PCB.

16 Claims, 6 Drawing Sheets

(56) References Cited

U.S. PATENT DOCUMENTS

| | | | |
|---|---|---|---|
| 2006/0133036 A1* | 6/2006 | Durney | G06F 1/20 361/695 |
| 2007/0091564 A1* | 4/2007 | Malone | H05K 7/20727 361/695 |
| 2015/0036287 A1* | 2/2015 | Ross | G06F 1/20 361/679.48 |
| 2017/0262029 A1* | 9/2017 | Nelson | G06F 1/20 |

* cited by examiner

UNDER-MOTHERBOARD AIR COOLING PLENUM

FIELD

This disclosure relates generally to cooling internal components of an Information Handling System (IHS), and more specifically, to airflow cooling within an IHS.

BACKGROUND

As the value and use of information continues to increase, individuals and businesses seek additional ways to process and store information. An option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Components of an IHS consume electrical power and can generate significant amounts of heat. Heat within an IHS may degrade the reliability and performance of various internal components of the IHS, possibly resulting in costly malfunctions and component failures. In order to circulate heated air away from internal components, an IHS may utilize a cooling fan, or a plurality of cooling fans organized within an airflow cooling system. As temperatures within the IHS increase, the cooling fans may ventilate heated air from within the IHS, or from within certain internal compartments of the IHS. Certain IHSs may utilize a single cooling fan to ventilate heated air from within the IHS. Other IHSs may utilize airflow cooling systems that include one or more banks of cooling fans and a fan controller that is configured to monitor and control the cooling fans.

The airflow generated by such cooling fans may not provide sufficient cooling to components installed at locations furthest away from the cooling fans, or at other locations that receive limited airflow from the cooling fans. Providing better cooling to such components may be accomplished by increasing the airflow velocity of the cooling fans, thus resulting in increased energy consumption and noise. In addition, increasing the airflow velocity generated by the cooling fans may nonetheless provide insufficient airflow for certain components. Cooling such components may also be addressed by incorporating more cooling fans, but such solutions require additional cost and complexity, in addition to increasing the noise and energy requirements of the airflow cooling system.

SUMMARY

In various embodiments, an IHS includes: a printed circuit board (PCB) provided airflow cooling by a plurality of cooling fans located on a proximal end of the PCB, wherein one or more hardware components are installed on a topside of the PCB; a first hardware component installed on the topside of a distal end of the PCB, wherein the first hardware component comprises one or more cooling elements that extend to an underside of the PCB; and a plenum extending from the proximal end of the PCB towards the distal end of the PCB, wherein the plenum is installed on the underside of the PCB.

In various additional embodiments of the IHS, the plenum draws air from the plurality of cooling fans via an intake at the proximal end of the PCB. In various additional embodiments of the IHS, the plenum delivers the air drawn via the intake to the one or more cooling elements of the first hardware component. In various additional embodiments of the IHS, the one or more cooling elements comprise a heat sink. In various additional embodiments of the IHS, the width of the plenum at the proximal end of the PCB is greater than the width of the plenum at the distal end of the PCB. In various additional embodiments of the IHS, the plenum comprises a plastic duct. In various additional embodiments, the IHS further includes a motherboard base tray attached to the chassis of the IHS, wherein the motherboard is attached to the motherboard base tray, and wherein the plenum is formed from the motherboard base tray. In various additional embodiments, the IHS further includes; a second hardware component installed on the topside of the distal end of the PCB, wherein the second hardware component comprises one or more cooling elements that extend to the underside of the PCB, and wherein the plenum is comprised of a first branch that extends towards the one or more cooling elements of the first hardware component and a second branch that extends towards the one or more cooling elements of the second hardware component. In various additional embodiments of the IHS, the plenum extends towards the distal end of the PCB past a portion of the one or more cooling elements of the first hardware component.

In various embodiments, a plenum extends from a proximal end of a printed circuit board (PCB) towards a distal end of the PCB, wherein one or more hardware components are installed on a topside of the PCB, and wherein the PCB is provided airflow cooling by a plurality of cooling fans located on the proximal end of the PCB, and wherein the plenum is installed on an underside of the PCB and transfers air from the proximal end of the PCB to one or more cooling elements of a first hardware component installed on the topside of the distal end of the PCB, wherein the one or more cooling elements extend to the underside of the PCB.

In various additional embodiments of the plenum, the plenum draws air from the plurality of cooling fans via the intake at the proximal end of the PCB. In various additional embodiments of the plenum, the plenum delivers air drawn via an intake at the proximal end for the PCB to the one or more cooling elements of the first hardware component. In various additional embodiments of the plenum, the one or more cooling elements of the first hardware component comprise a heat sink. In various additional embodiments of the plenum, the width of the plenum at the proximal end of the PCB is greater than the width of the plenum at the distal end of the PCB. In various additional embodiments of the plenum, the plenum is a plastic duct. In various additional embodiments of the plenum, the plenum is formed from a motherboard base tray attached to the chassis of the IHS, and wherein the motherboard is attached to the motherboard base tray. In various additional embodiments of the plenum, the plenum is comprised of a first branch that extends towards the one or more cooling elements of the first hardware component and a second branch that extends towards the one or more cooling elements of a second hardware component installed on the topside of the distal end of the PCB, wherein the one or more cooling elements of the second hardware component extend to the underside of the PCB. In various additional embodiments of the plenum, the plenum extends towards the distal end of the PCB past a portion of the one or more cooling elements of the first hardware component.

In various embodiments, a system provides airflow cooling of a first hardware component. The system includes: a printed circuit board (PCB) provided airflow cooling by a plurality of cooling fans located on a proximal end of the PCB, wherein the first hardware component is installed on the topside of a distal end of the PCB, and wherein the first hardware component comprises one or more cooling elements that extend to an underside of the PCB; and a plenum extending from the proximal end of the PCB towards the distal end of the PCB, wherein the plenum is installed on the underside of the PCB, and wherein the plenum draws air from the plurality of cooling fans via an intake at the proximal end of the PCB, and wherein the plenum delivers air drawn via an intake at the proximal end for the PCB to the one or more cooling elements of the first hardware component.

In various additional embodiments of the system, the width of the plenum at the proximal end of the PCB is greater than the width of the plenum at the distal end of the PCB.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, a network router, a network video camera, a data recording device used to record physical measurements in a manufacturing environment, or any other suitable device and may vary in size, shape, performance, functionality, and price. The IHS may include memory, one or more processing resources, e.g., a central processing unit (CPU) or hardware or software control logic. Additional components or the IHS may include one or more storage devices, one or more communications ports for communicating with external devices as well as various input and output (I/O) devices, e.g., a keyboard, a mouse, and a video display. The IHS may also include one or more buses operable to transmit communication between the various hardware components.

Figure 1:
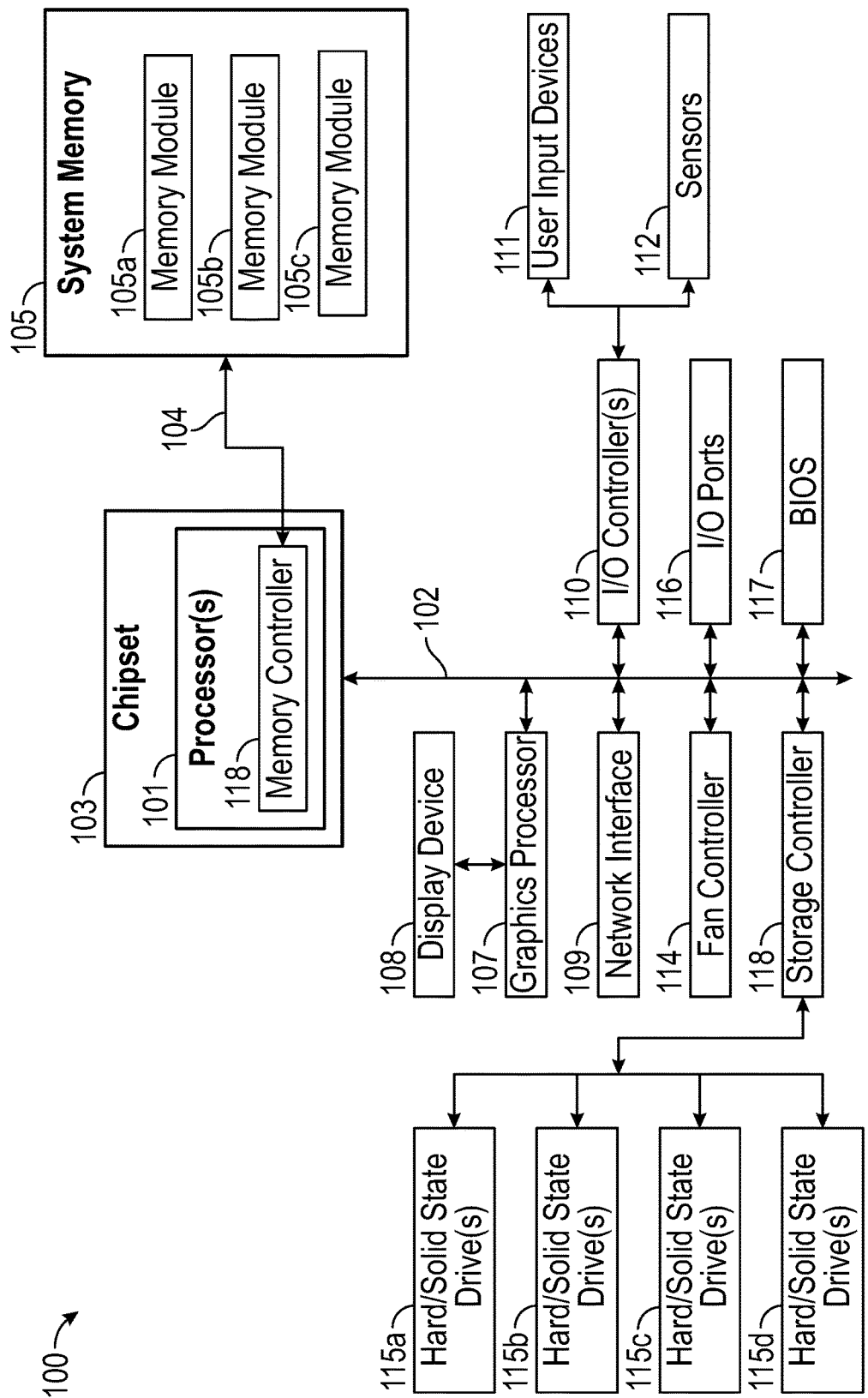
FIG. 1 is a block diagram depicting certain components of an IHS configured according to various embodiments.

FIG. 1 is a block diagram of an IHS 100 configured according to various embodiments to utilize an under-motherboard air cooling plenum. In various embodiments, IHS 100 may execute program instructions that cause IHS 100 to perform certain of the operations disclosed herein. While a single IHS 100 is illustrated in FIG. 1, IHS 100 may be a component of an enterprise system that may include any number of additional IHSs that may also be configured to utilize an under-motherboard air cooling plenum in the same or similar manner to IHS 100.

IHS 100 includes one or more processors 101, such as a Central Processing Unit (CPU), to execute code retrieved from a system memory 105. Although IHS 100 is illustrated with a single processor 101, other embodiments may include two or more processors, that may each be configured identically, or to provide specialized processing functions. Processor 101 may include any processor capable of executing program instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

In the embodiment of FIG. 1, the processor 101 includes an integrated memory controller 118 that may be implemented directly within the circuitry of the processor 101, or the memory controller 118 may be a separate integrated circuit that is located on the same die as the processor 101. The memory controller 118 may be configured to manage the transfer of data to and from the system memory 105 of the IHS 100 via a high-speed memory interface 104.

The system memory 105 that is coupled to processor 101 via the memory bus 104 provides the processor 101 with a high-speed memory that may be used in the execution of computer program instructions by the processor 101. Accordingly, system memory 105 may include memory components, such as such as static RAM (SRAM), dynamic RAM (DRAM), NAND Flash memory, suitable for supporting high-speed memory operations by the processor 101. In certain embodiments, system memory 105 may combine both persistent, non-volatile memory and volatile memory.

In certain embodiments, the system memory 105 may be comprised of multiple removable memory modules. The system memory 105 of the illustrated embodiment includes three removable memory modules 105a, 105b and 105c. Each of the removable memory modules 105a-c may correspond to a motherboard memory socket that receives a removable memory module 105a-c, such as a DIMM (Dual In-line Memory Module), that can be coupled to the socket and then decoupled from the socket as needed, such as to upgrade memory capabilities or to replace faulty components. Other embodiments of IHS 100 may be configured with memory socket interfaces that correspond to different types of removable memory modules, such as a Dual In-line Package (DIP) memory, a Single In-line Pin Package (SIPP) memory, a Single In-line Memory Module (SIMM), and/or a Ball Grid Array (BGA) memory.

IHS 100 utilizes a chipset 103 that may include one or more integrated circuits that are connect to processor 101. In the embodiment of FIG. 1, processor 101 is depicted as a component of chipset 103. In other embodiments, all of chipset 103, or portions of chipset 103 may be implemented directly within the integrated circuitry of the processor 101. Chipset 103 provides the processor(s) 101 with access to a variety of resources accessible via bus 102. In IHS 100, bus 102 is illustrated as a single element. Various embodiments may rely on any number of individual buses to provide the illustrated pathways served by bus 102.

As illustrated, a variety of resources may be coupled to the processor(s) 101 of the IHS 100 through the chipset 103. For instance, chipset 103 may be coupled to a network interface 109, such as provided by a Network Interface Controller (NIC) that is coupled to the IHS 100 and allows the IHS 100 to communicate via a network, such as the Internet or a LAN. Network interface device 109 may provide IHS 100 with wired and/or wireless network connections via a variety of network technologies, such as wireless cellular or mobile networks (CDMA, TDMA, LTE etc.), WIFI and BLUETOOTH. In certain embodiments, the network interface 109 may be coupled to the chipset 103 via a PCIe bus. In such embodiments, the network interface 109 may be installed in a PCIe expansion slot provided via the motherboard of IHS 100.

Chipset 103 may also provide access to one or more display device(s) 108 via graphics processor 107. In certain embodiments, graphics processor 107 may be comprised within one or more video or graphics cards or an embedded controller installed as components of the IHS 100. Graphics processor 107 may generate display information and provide the generated information to one or more display device(s) 108 coupled to the IHS 100. In certain embodiments, graphics processor 107 may be integrated within processor 101. The one or more display devices 108 coupled to IHS 100 may utilize LCD, LED, OLED, or other thin film display technologies. Each display device 108 may be capable of touch input such as via a touch controller that may be an embedded component of display device 108, graphics processor 107, or a separate component of IHS 100 accessed via bus 102.

In certain embodiments, chipset 103 may utilize one or more I/O controllers to access hardware components such as user input devices 111 and sensors 112. For instance, I/O controller 110 may provide access to user-input devices 110 such as a keyboard, mouse, touchpad, touchscreen and/or other peripheral input devices. The user input devices may interface with the I/O controller 110 through wired or wireless connections. Sensors 112 accessed via I/O controllers 110 may provide access to data describing environmental and operating conditions of IHS 100. Other components of IHS 100 may include one or more I/O ports 116 for communicating with peripheral external devices as well as various input and output devices. For instance, I/O 116 ports may include USB (Universal Serial Bus) ports, by which a variety of external devices may be coupled to IHS 100.

As illustrated, IHS 100 also includes a BIOS (Basic Input/Output System) 117 that may be stored in a non-volatile memory accessible by chipset 103 via bus 102. The BIOS 117 provides an abstraction layer that allows the operating system to interface with the hardware components of the IHS 100. Upon powering or restarting IHS 100, processor(s) 101 may utilize BIOS 117 instructions to initialize and test hardware components coupled to the IHS 100, including both components permanently installed as components of the motherboard of IHS 100 and removable components installed within the various expansion slots supported by the IHS 100. The BIOS 117 instructions may also load an operating system for use by the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI. In certain embodiments, the BIOS may be replaced, in full or in part, by a baseboard management controller (BMC) or another in-band or out-of-band controller that supports remote administration of IHS 100.

In the illustrated embodiment, IHS 100 includes four storage drives 115a-d. In various embodiments, any number of storage drives may be supported and the storage drives 115a-d may include SAS (Serial Attached SCSI) magnetic disk drives, SATA (Serial Advanced Technology Attachment) magnetic disk drives, solid-state drives (SSDs) and other types of storage drives in various combinations. Each of the storage drives 115a-d may be located within the enclosure of the IHS 100, or alternatively one or more of the storage drives 115a-d may instead be external to IHS 100. One or more of the storage drives 115a-d may instead be located remotely from IHS 100 and may be configured as network attached storage devices. Using these four storage drives 115a-d, IHS 100 may be configured as a server that provides various services as a part of a cloud implementation of multiple servers that may be distributed across multiple physical locations. In certain embodiments, the four storage drives 115a-d may be components of a RAID (Redundant Array of Independent Disks) system.

In providing storage services, IHS 100 is may utilize a storage controller 118 that provides access to the four storage drives 115a-d. In certain embodiments, the storage controller 118 may be a RAID controller that is configured to provide access to storage drives 115a-d as components of a RAID system. In various embodiments, storage controller 118 may be comprised of hardware and software that is configured to provide storage and retrieval of data from the storage drives 115a-d. Storage controller 118 may be configured to provide access to the four storage drives 115a-d as a single logical storage device as part of a distributed data storage solution. Certain embodiments may utilize additional storage controllers that provide access to additional storage devices.

In the illustrated embodiment, IHS 100 also includes a fan controller 114 that is used to operate a cooling system that may be comprised of one or more cooling fans. The fan controller 114 may be configured to interoperate with one or more environmental sensors 112 in order to monitor temperature conditions at internal locations within the IHS 100, such as in proximity to processor 101. Based on temperature measurements collected by sensors 112, the fan controller 114 may activate or increase the speed of cooling fans in order to ventilate heated air from within the IHS 100.

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 101 as a systems-on-a-chip.

Figure 2:
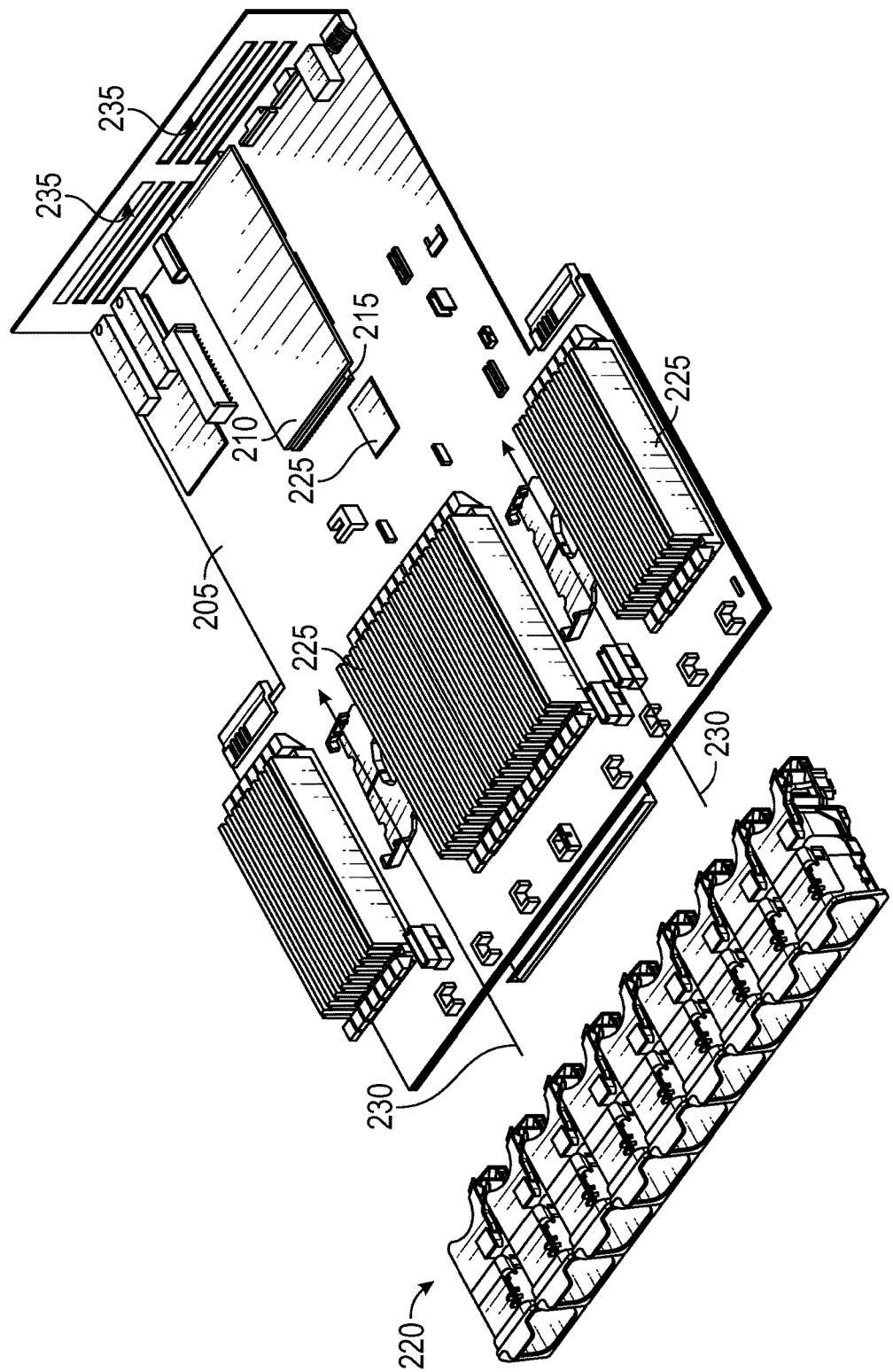
FIG. 2 is an illustration depicting airflow cooling within an IHS.

FIG. 2 depicts airflow cooling provided within an IHS and illustrates certain of the difficulties in providing airflow cooling to some internal components due to their location within and air-cooled, internal compartment of the IHS. In the IHS illustrated in FIG. 2, airflow cooling is provided by a bank of cooling fans 220 that draw in ambient air and force this ambient air into the air-cooled internal compartment of the IHS, thus venting heated air from within this internal compartment. Within the internal compartment of the IHS that is cooled by the bank of cooling fans 220, a motherboard 205, or other component constructed using printed circuit board, supports a variety of internal components 210 and 225 that are cooled based on the airflow generated by the bank of cooling fans 220.

The internal components 210 and 225 installed on motherboard 205 may be categorized based on their installed location on the motherboard 205 relative to the cooling fans 220. The first category of internal components 225 are installed on motherboard 205 at locations near the cooling fans 220. Based on their locations, these internal components 225 consequently receive the ambient airflow drawn in by the cooling fans 220 while this airflow is still at or near the ambient air temperature. The second category of internal components 210 are installed at locations on the motherboard 205 furthest from the cooling fans 220. These furthest internal components 210 on the motherboard 205 may also be cooled by the airflow from the bank of cooling fans 220. However, the airflow generated by the cooling fans 220, in the direction specified by arrows 230, provides less effective cooling for such internal components 210 that are furthest from the cooling fans.

As the ambient airflow drawn in by cooling fans 220 is forced into the internal compartment of the IHS, this airflow is progressively warmed by the internal components 225 installed on the motherboard 205 closest to the cooling fans 220 before the airflow 230 finally reaches the furthest components 210. The internal components 225 closest to the cooling fans 220 may include a variety of different types heat-generating components that are installed on the printed circuit board, and may also include various types of connectors that may support a wide variety of different types of memory, networking, processing or storage functions. Many of such components may also be expected to generate significant amounts of heat, thus heating the airflow generated by cooling fans 220 as the airflow 230 progresses towards the furthest internal components 210. In certain scenarios, the airflow reaches the furthest internal components 210 already near the thermal limit for these furthest components 210. In such scenarios, the airflow velocity generated by the cooling fans must be increased, or the operation of component 210 must be downgraded in a manner that results in lower operating temperatures.

Compounding the difficulty of cooling certain motherboard components that are installed at locations furthest from the cooling fans is the configuration of some IHS components to utilize cooling elements that protrude to the underside of the motherboard 205. As illustrated in additional detail with regard to FIG. 3, certain motherboard components, such as component 210, may include a heat sink or other type of cooling structure that protrudes below the top surface of the motherboard 205 to which internal components 210 are installed. The airflow generated by cooling fans 220, in direction 230, is not only heated by the time it reaches internal component 210, the airflow must also travel through gaps 215 in the printed circuit board along the perimeter of the installed component 210. Airflow through these small sized gaps 215 results in high levels of impedance in the airflow to the cooling elements on the underside of component 210. In many scenarios, components located furthest from the cooling fans are also in proximity to the vents 235 by which heated air is forced out of the air-cooled compartment. In FIG. 2, six rectangular vents 235 are shown on a panel that forms part of a compartment in which the motherboard 205 is installed. Various other configurations of vents may be utilized. Such vents 235 typically create less impedance than the gaps 215 through which airflow must reach the cooling elements of component 210. Due to this impedance differential, a significant portion of the airflow that does reach component 210 may be drawn out of nearby vents 235 instead of being drawn into gaps 215 that surround component 210. For all of these reasons, airflow cooling for motherboard components such as component 210 may be significantly limited.

Figure 3:
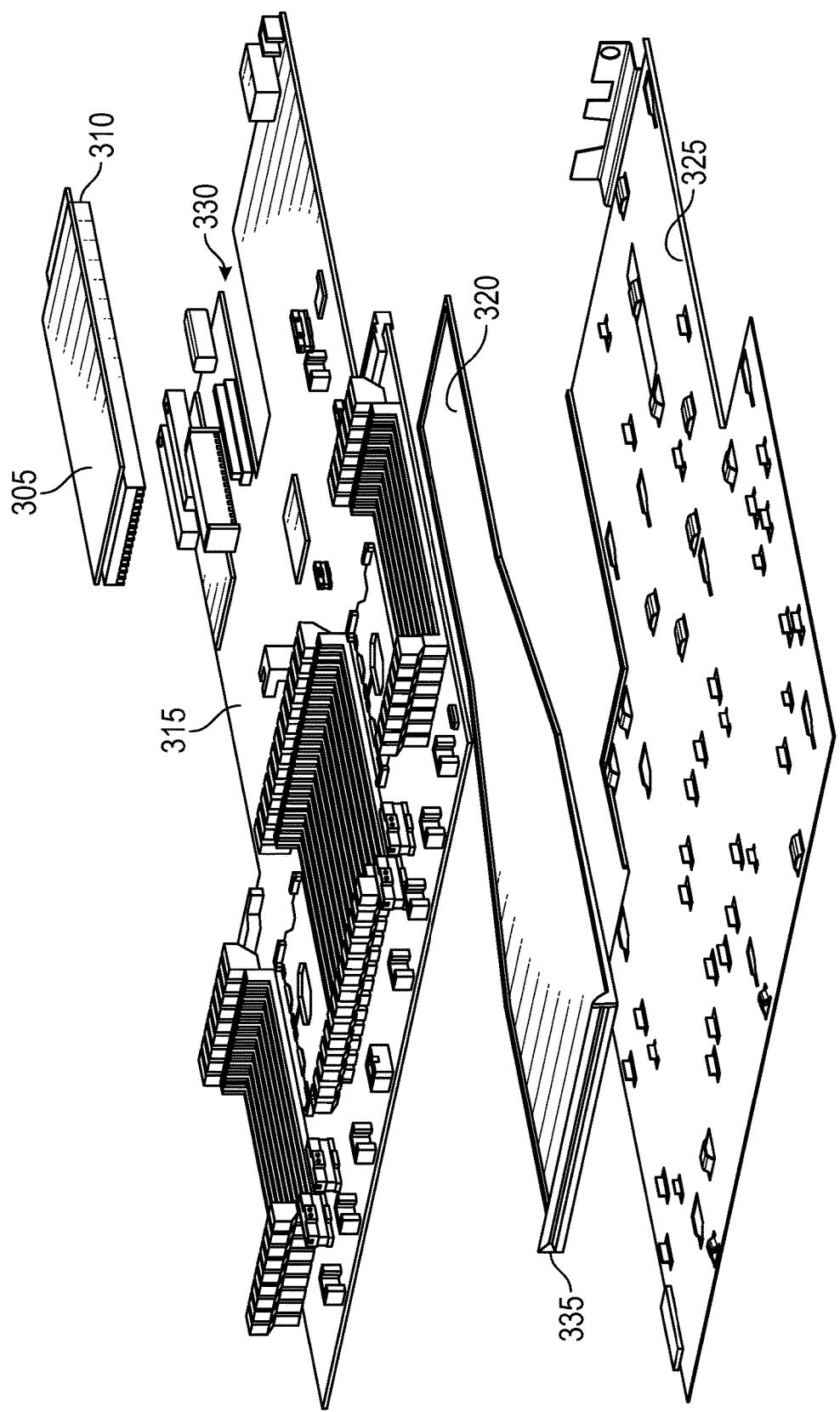
FIG. 3 is an illustration depicting an under-motherboard air cooling plenum according to various embodiments.

FIG. 3 is an illustration depicting an under-motherboard air cooling plenum according to various embodiments. As described, a motherboard 315 may accommodate an internal component 305 that is installed on the top side of motherboard 315 and includes cooling elements 310 that protrude into the area below the printed circuit board from which the motherboard is constructed. In the illustrated embodiment, the component 305 is installed within an open channel or slot 330 in the printed circuit board of the motherboard 315, such that the component 305 is secured to top side motherboard 315, but the cooling elements 310 of the component 305 extend through the channel 330 and protrude below the motherboard 315. As described, the airflow generated by cooling fans located as illustrated in FIG. 2 is progressively heated before it reaches component 305 located at the furthest end of the motherboard 315 from the cooling fans. In addition, the preheated airflow that does reach component 305 is impeded by the small gaps through which the air must flow in reaching the cooling elements 310 below the surface of the motherboard 315.

Also illustrated in FIG. 3 is an air cooling plenum 320 according to certain embodiments, where the plenum is installed underneath the motherboard 315. The air cooling plenum 320 draws in fresh air from inlet 335 that is located at the edge of the motherboard 315 in proximity to the high-pressure airflow generated by the cooling fans. The air cooling plenum 320 delivers the air drawn from inlet 335 to the cooling elements 310 of component 310 that protrude through channel 330 and extend below motherboard 315. By drawing in air from inlet 335 and directing this drawn air underneath motherboard 315, the air cooling plenum 320 provides air cooling to component 305 without reliance on the airflow that is heated by the heat-generating motherboard components that are installed on the top side of the motherboard. By avoiding the heat from the topside of the motherboard, significantly cooler airflow may be provided to components that are typically difficult to cool, thus allowing for cooling to be provided with lower cooling fan velocities.

In the illustrated embodiment, the air cooling plenum 320 is installed between the underside of the motherboard 315 and a motherboard mounting plate 325. Certain embodiments may utilize a motherboard mounting plate 325 that allows the motherboard to be manipulated during installation without contacting the actual motherboard 315. The motherboard mounting plate 325 may also serve to attach the motherboard 315 to the chassis of the IHS with minimal contact to the motherboard 315. In such scenarios, the air cooling plenum 320 may provide an airflow pathway that extends in the area between the motherboard 315 and the motherboard mounting plate 325, where the airflow provided by the air cooling plenum 320 is not heated by the components installed on the top side of motherboard 315.

Figure 4:
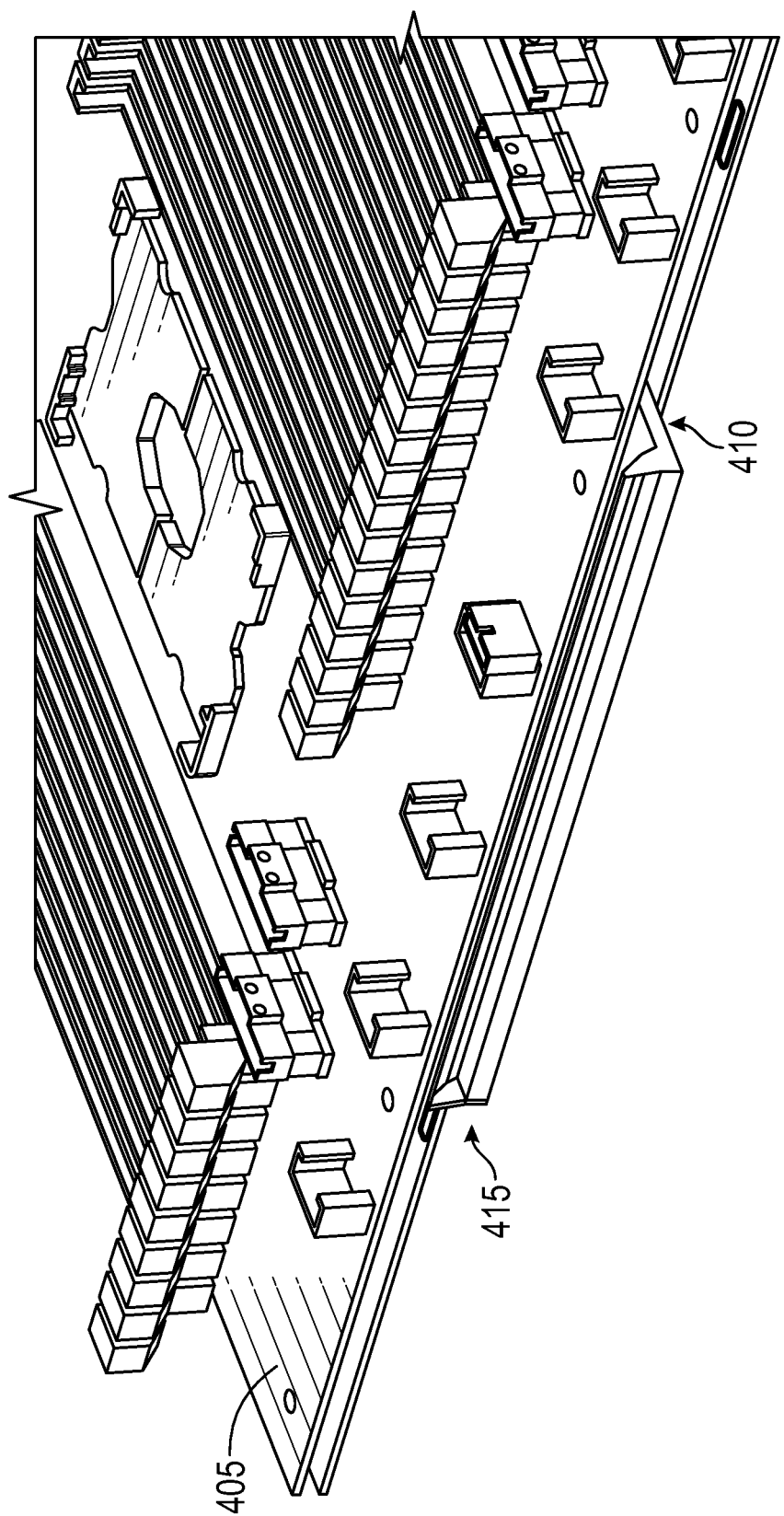
FIG. 4 is an illustration depicting the airflow intake of an under-motherboard air cooling plenum according to various embodiments.

FIG. 4 is an illustration depicting the inlet 415 of an under-motherboard air cooling plenum 410 according to various embodiments. As with the embodiment of FIG. 3, the air cooling plenum 410 is installed on the bottom of motherboard 405, opposite the top surface to which the various motherboard components are installed. In certain embodiments, the air cooling plenum 410 may be constructed from a plastic or other synthetic polymer material. In the illustrated embodiment, the air cooling plenum 410 is a hollow duct. In various embodiments, the inner hollow structure of the air cooling plenum 410 may be divided into one or more separate chambers that run through the inner hollow structure of the air cooling plenum 410. Once installed, the inlet 415 protrudes beyond the edge of the motherboard 405 such that the inlet 415 may be located near an area of high-pressure airflow generated by the cooling fans. The inlet 415 may thus draw in ambient air from the cooling fans and into the hollow, inner chamber of the air cooling plenum 410.

In various embodiments, the cross-sectional area of intake inlet 415 may be selected according to the airflow cooling requirements of the internal component being cooled by the air cooling plenum 410. For instance, in certain embodiments, the width of inlet 415, may extend along a greater length of the front-facing edge of motherboard 405 in order to increase the cross-sectional area of the inlet 415, and thus allow for more air to be drawn in from the cooling fans. Various embodiment may also utilize various inlet 415 shapes for creating a pressure differential effective in drawing in high-pressure air from the cooling fans.

Figure 5:
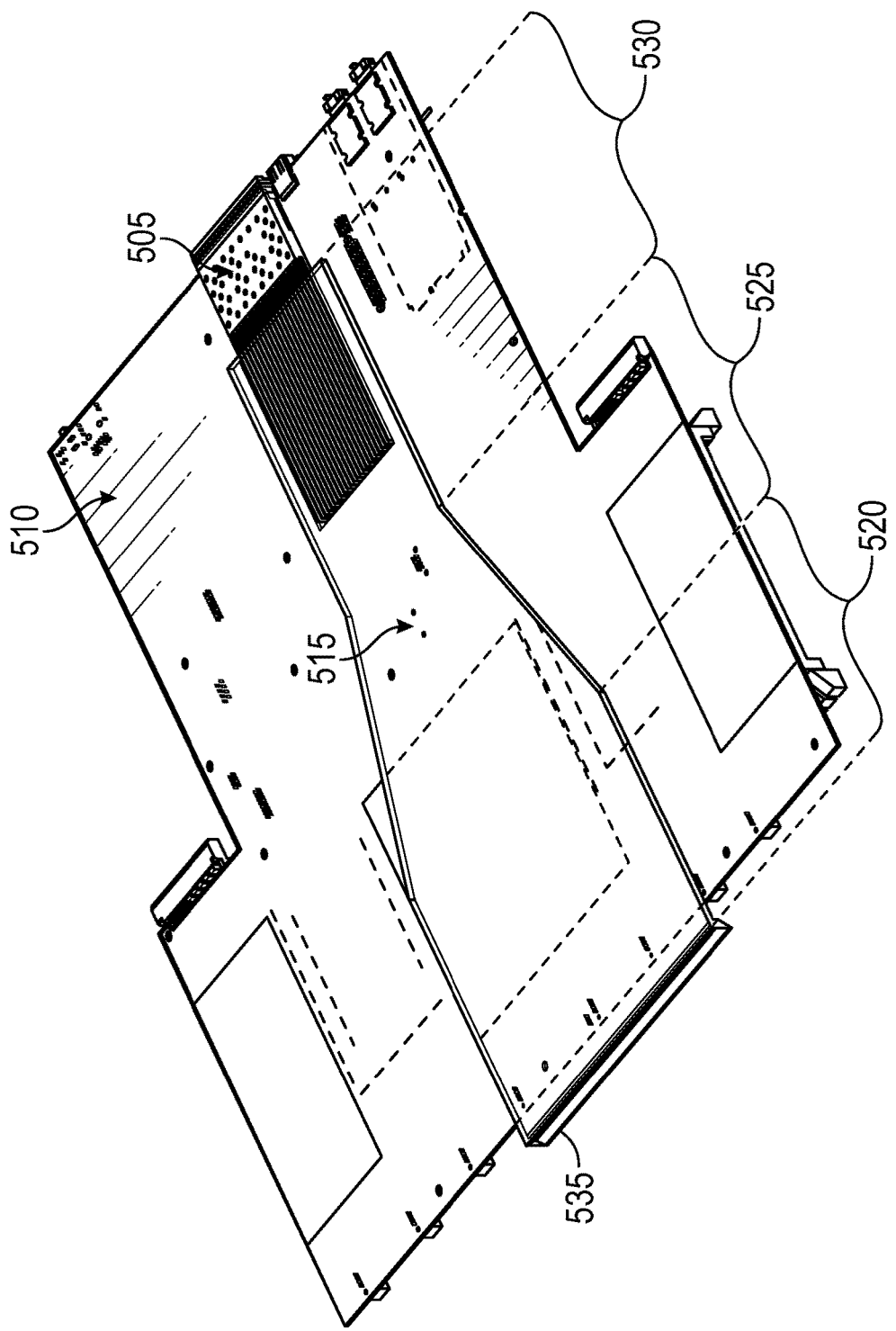
FIG. 5 is an illustration depicting an installed under-motherboard air cooling plenum according to various embodiments.

FIG. 5 is an illustration depicting an installed under-motherboard air cooling plenum 515 according to various embodiments. Where FIGS. 2-4 illustrate the topside of a motherboard, the embodiment of FIG. 5 illustrates the underside of a motherboard 510 that is provided airflow cooling by cooling fans forcing air in the same direction as described with regard to FIGS. 2-4. As described, such airflow cooling does not efficiently provide airflow cooling to certain components, such as component 505, that are installed on the topside of the motherboard 510, but which include cooling elements that protrude to the underside of motherboard 510. In order for the airflow from the topside of the motherboard 510 to provide cooling to component 505, the airflow must traverse high-impedance airflow pathways between the installed component 505 and the motherboard 510.

As illustrated, the air cooling plenum 515 may be installed such that it transfers air drawn from inlet 535 under motherboard 510. The air cooling plenum may be installed such that inlet 535 is located on the side of the motherboard 510 that is closest to one or more cooling fans that provide airflow cooling to the components installed on the topside of the motherboard 510. As illustrated, the air cooling plenum 515 may be shaped in a manner that delivers the air drawn from the intake 535 to the cooling elements of component 505 that extend to the underside of motherboard 510. Configured in such a manner, an air cooling plenum 515 may provide improved airflow cooling to component 505 and other such components located furthest from the cooling fans that provided airflow to the components installed on the motherboard 510.

In the illustrated embodiment, the shape of the air cooling plenum 515 may be described as three sections. The front section 520 includes the inlet 535 that draws in ambient air from the cooling fans. As described above, the width of the inlet 535 may be varied based on the airflow cooling requirements of the component 505 being cooled by the air cooling plenum 515. The width of the front section 520 of the plenum corresponds to the width of the inlet 535. The air cooling plenum 515 also includes a middle section 525 in which the width of the plenum narrows as it extends towards the component 505 being cooled. The width of the rear section 530 of the plenum corresponds to the width of the channel through which the cooling elements of component 505 extend into the underside of the motherboard 510. Shaped in such a manner, the narrowing of the air cooling plenum 515 as it extends towards the component 505 being cooled may serve to increase the velocity of the airflow as it flows within the plenum 515, thus further improving the airflow cooling provided by the plenum 515 to component 505. Embodiments may utilize various different airflow cooling plenum geometries based on the cooling requirements of the component(s) being cooled.

As described with regard to FIG. 3, a motherboard may include one or more slots or channels 330 into which the cooling elements of a motherboard component may protrude. In FIG. 5, the cooling elements of component 505 protrude into a slot in the printed circuit board from which the motherboard 510 constructed. The component 505 may be installed using electrical and mechanical connections provided on the topside of the motherboard 510. In various embodiments, the cooling elements of component 505 may include one or more heatsinks, each with various configurations of cooling fins that may extend into the various slots or channels in the motherboard.

As illustrated in FIG. 5, the air cooling plenum 515 may extend towards component 505 such that plenum covers a portion of the cooling elements of component 505 that extend to the underside of motherboard 510. In various embodiments, the air cooling plenum 515 may cover various portions of the cooling elements that extend to the underside of the motherboard. In certain embodiments, such as the embodiment of FIG. 5, the air cooling plenum 515 covers approximately half of the cooling elements of component 505, with the remaining cooling elements remaining exposed below the motherboard 510. Such a configuration may allow for ambient air to be delivered to the cooling elements via the air cooling plenum 515, while limiting the airflow impedance caused by cooling elements themselves, thus maintaining the pressure differential within the air cooling plenum 515 that facilitates drawing in air from inlet 535.

Figure 6:
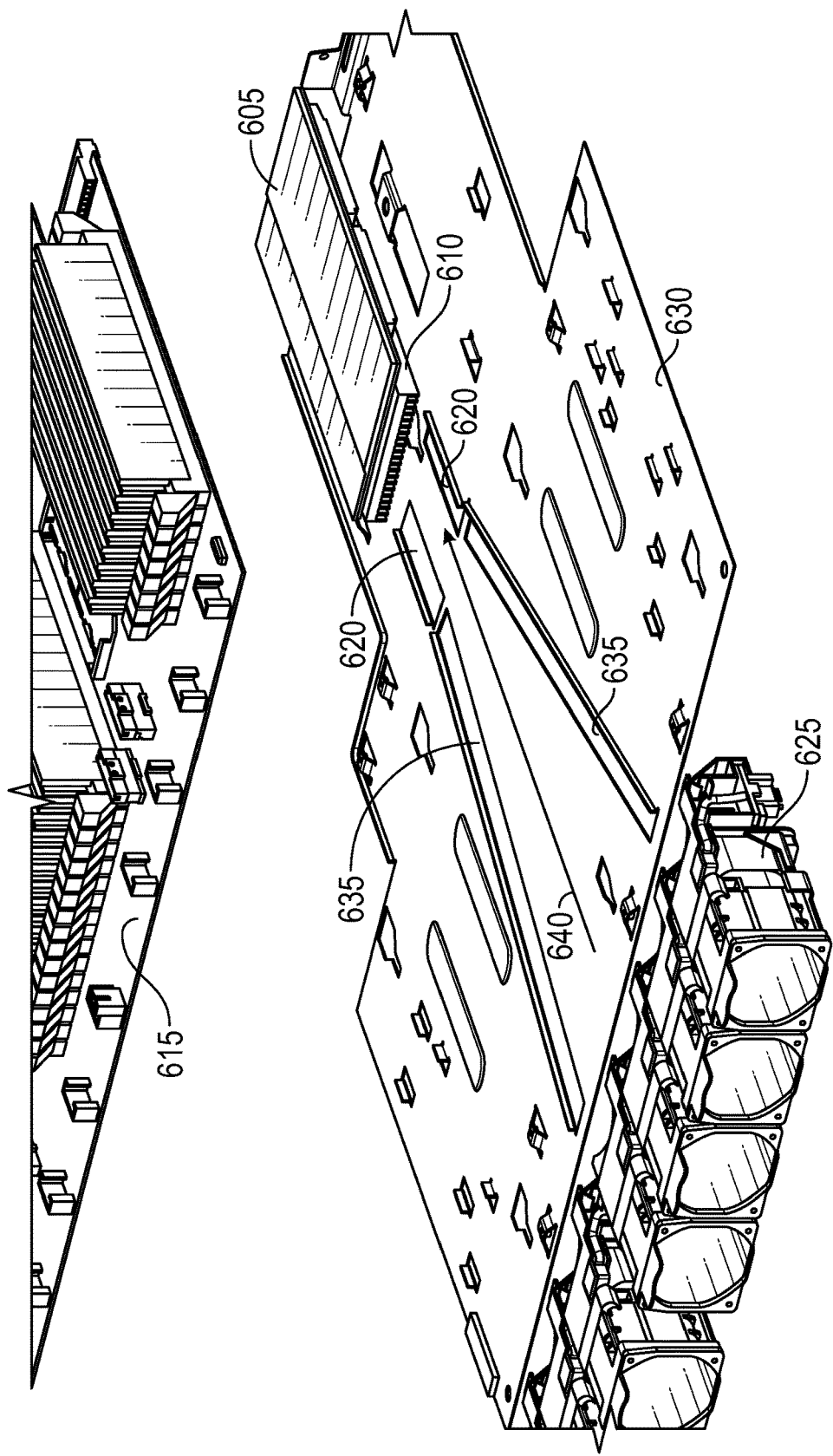
FIG. 6 is an illustration depicting an under-motherboard air cooling plenum according to various embodiments.

FIG. 6 is an illustration depicting an under-motherboard air cooling plenum according to various embodiments, where the airflow cooling plenum is formed from flanges 635, 620 that are attached to the motherboard mounting plate 630. As with the above embodiments, the component 605 installed on the topside of motherboard 615 includes cooling elements 610 that protrude to the underside of the motherboard 615 via a slot in the printed circuit board from which the motherboard 615 is constructed. As described, a motherboard 615 may be fastened to a motherboard mounting plate 630 in order to facilitate handling of the motherboard during its installation. For sake of illustrating the cooling provided by the airflow cooling plenum formed from flanges 635, 620, in FIG. 6, component 605 is shown attached to the motherboard mounting plate 630 and not attached to the motherboard 615 that is depicted above the motherboard mounting plate 630.

In the embodiment of FIG. 6, the airflow cooling plenum may be formed from flanges 635, 620 that draw in airflow from cooling fans 625 and direct the airflow 640 to the cooling elements 610 of component 605 that protrude below motherboard 615. As illustrated, one set of flanges 635 are positioned to draw in airflow from cooling fans 625 along the length of the motherboard mounting plate 630. These flanges 635 are angled such that the pathway of the airflow 640 narrows until it reaches flanges 620 that are spaced according to the width of the component 605. As described with the plenum of FIG. 5, the narrowing of the airflow pathway created by the arrangement of flanges 620, 635 serves to increase the velocity of the airflow 640 as it reaches component 605. Other embodiments may utilize a single flange or a greater number of flanges in creating an airflow pathway in the space between the motherboard mounting plate 630 and the motherboard 615.

In the illustrated embodiment, the flanges 635, 620 are structures that are attached to the motherboard mounting plate 630. Other embodiments may utilize different types of structures that are attached to the motherboard mounting plate 630 and similarly direct airflow 640 from cooling fans 625 to component 605. In certain embodiments, rather than formed from structures that are attached to the motherboard mounting plate 630, the air cooling plenum may be formed from various folds and/or geometric shapes that may be stamped into the motherboard mounting plate 630 to create a cavity that operates similar to the air cooling plenum described in the above embodiments.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Also for purposes of this disclosure, computer-readable media may include any instrumentality or aggregation of instrumentalities that may retain data and/or instructions for a period of time. Computer-readable media may include, without limitation, storage media, e.g., a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory. Computer-readable media may also include optically readable barcodes (one or two-dimensional), plastic cards with embedded magnetic stripes, mechanically or optically read punched cards, or radio frequency identification tags.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An IHS (Information Handling Systems) comprising:
   a printed circuit board (PCB) provided airflow cooling by a plurality of cooling fans located on a proximal end of the PCB, wherein one or more hardware components are installed on a topside of the PCB;
   a first hardware component installed on the topside of a distal end of the PCB, wherein the first hardware component comprises one or more cooling elements that extend to an underside of the PCB; and
   a plenum extending from the proximal end of the PCB towards the distal end of the PCB, wherein the plenum is installed on the underside of the PCB, and wherein the plenum draws air from the plurality of cooling fans via an intake at the proximal end of the PCB.

2. The IHS of claim 1, wherein the plenum delivers the air drawn via the intake to the one or more cooling elements of the first hardware component.

3. The IHS of claim 1, wherein the one or more cooling elements comprise a heat sink.

4. The IHS of claim 1, wherein the width of the plenum at the proximal end of the PCB is greater than the width of the plenum at the distal end of the PCB.

5. The IHS of claim 1, wherein the plenum comprises a plastic duct.

6. The IHS of claim 1, further comprising:
   a motherboard base tray, wherein a motherboard is attached to the motherboard base tray, and wherein the plenum is formed from the motherboard base tray.

7. The IHS of claim 1, wherein the plenum extends towards the distal end of the PCB past a portion of the one or more cooling elements of the first hardware component.

8. A plenum extending from a proximal end of a printed circuit board (PCB) towards a distal end of the PCB, wherein one or more hardware components are installed on a topside of the PCB, and wherein the PCB is provided airflow cooling by a plurality of cooling fans located on the proximal end of the PCB, and wherein the plenum is installed on an underside of the PCB and transfers air from the proximal end of the PCB to one or more cooling elements of a first hardware component installed on the topside of the distal end of the PCB, wherein the one or more cooling elements extend to the underside of the PCB, and wherein the plenum draws air from the plurality of cooling fans via an intake at the proximal end of the PCB.

9. The plenum of claim 8, wherein the plenum delivers air drawn via the intake at the proximal end for the PCB to the one or more cooling elements of the first hardware component.

10. The plenum of claim 8, wherein the one or more cooling elements of the first hardware component comprise a heat sink.

11. The plenum of claim 8, wherein a width of the plenum at the proximal end of the PCB is greater than a width of the plenum at the distal end of the PCB.

12. The plenum of claim 8, wherein the plenum comprises a plastic duct.

13. The plenum of claim 8, wherein the plenum is formed from a motherboard base tray, and wherein a motherboard is attached to the motherboard base tray.

14. The plenum of claim 8, wherein the plenum extends towards the distal end of the PCB past a portion of the one or more cooling elements of the first hardware component.

15. A system for airflow cooling of a first hardware component, the system comprising a printed circuit board (PCB) provided airflow cooling by a plurality of cooling fans located on a proximal end of the PCB, wherein the first hardware component is installed on the topside of a distal end of the PCB, and wherein the first hardware component comprises one or more cooling elements that extend to an underside of the PCB; and a plenum extending from the proximal end of the PCB towards the distal end of the PCB, wherein the plenum is installed on the underside of the PCB, and wherein the plenum draws air from the plurality of cooling fans via an intake at the proximal end of the PCB, and wherein the plenum delivers air drawn via the intake at the proximal end of the PCB to the one or more cooling elements of the first hardware component.

16. The system of claim 15, wherein a width of the plenum at the proximal end of the PCB is greater than a width of the plenum at the distal end of the PCB.

* * * * *